United States Patent [19]

Jennings

[11] 4,342,143
[45] Aug. 3, 1982

[54] METHOD OF MAKING MULTIPLE ELECTRICAL COMPONENTS IN INTEGRATED MICROMINIATURE FORM

[76] Inventor: Thomas A. Jennings, 518A Oak Summit Apts., Glenside, Pa. 19038

[21] Appl. No.: 901,994

[22] Filed: May 1, 1978

Related U.S. Application Data

[63] Continuation of Ser. No. 711,990, Aug. 5, 1976, abandoned, which is a continuation-in-part of Ser. No. 707,881, Jul. 22, 1976, abandoned, which is a continuation of Ser. No. 439,350, Feb. 4, 1974, abandoned.

[51] Int. Cl.³ .................... H01G 4/30; H01F 41/04
[52] U.S. Cl. ............................. 29/25.42; 29/602 R; 29/620; 29/846; 326/200; 361/313; 361/330; 361/402; 427/79; 427/96; 427/103
[58] Field of Search ............... 29/602 R, 620, 25.42, 29/625, 846; 361/402, 313, 330; 336/200; 427/79, 96, 101–103

[56] References Cited

U.S. PATENT DOCUMENTS

| | | | |
|---|---|---|---|
| 2,937,410 | 5/1960 | Davies et al. | 29/832 |
| 3,413,716 | 12/1968 | Schwertz et al. | 29/602 R |
| 3,484,654 | 12/1969 | Honeiser | 361/402 |
| 3,785,046 | 1/1974 | Jennings | 29/602 R |
| 3,798,059 | 3/1974 | Astle et al. | 29/602 R X |
| 4,117,588 | 10/1978 | Johnson | 29/602 R X |

Primary Examiner—Carl E. Hall
Attorney, Agent, or Firm—Stuart E. Beck

[57] ABSTRACT

Integrated structures of various combinations of inductors, capacitors and resistors are formed by bonded laminations of films of electrical conductors of desired configurations and electrical properties separated by films of dielectric material. Electrical terminals extending from appropriate ones of the conductors may be interconnected selectively to provide various single, series and parallel circuit component arrangements.

4 Claims, 18 Drawing Figures

METHOD OF MAKING MULTIPLE ELECTRICAL COMPONENTS IN INTEGRATED MICROMINIATURE FORM

CROSS REFERENCE TO RELATED APPLICATION

This is a continuation of application Ser. No. 711,990, filed Aug. 5, 1976, now abandoned, which is a continuation-in-part of application Ser. No. 707,881 filed July 22, 1976, now abandoned, which was a continuation of application Ser. No. 439,350 filed Feb. 4, 1974, now abandoned.

BACKGROUND OF THE INVENTION

This invention relates to electrical components, and more particularly to multiple electrical components assembled together in a solid, one-piece integrated structure.

The use of inductors, capacitors and resistors in electronic circuitry is well known. Their use in microelectronics and other hybrid industries heretofore has been limited because of the size of the discreet components, of the costs involved in their assembly into circuit configurations and the undesirable electrical circuit characteristics resulting from changes in inductance and capacitance due to the effects of the leads employed to interconnect the discreet components.

SUMMARY OF THE INVENTION

In its basic concept, this invention provides a plurality of electrical components in a single integrated, microminiature structure by forming a laminate of a plurality of films of electrically conductive material of desired configurations and electrical characteristics, separated by films of dielectric material, the terminals of the conductors being capable of selective connection to form diverse single, series and parallel circuit component arrangements.

It is by virtue of the foregoing basic concept that the principal objective of this invention is achieved; namely, to overcome the aforementioned limitations and disadvantages heretofore associated with the use of discrete electrical components.

Another important object of this invention is the provision of multiple electrical components in integrated, microminiature form which are of simplified construction for economical manufacture in a wide variety of arrangements of component elements.

The foregoing and other objects and advantages of this invention will appear from the following detailed description, taken in connection with the accompanying drawings of preferred embodiments.

BRIEF DESCRIPTION OF THE DRAWINGS

FIGS. 3a-10a are schematic electrical diagrams of single, series and parallel circuit component arrangements available from the corresponding assemblies illustrated in FIGS. 3-10, respectively.

DESCRIPTION OF THE PREFERRED EMBODIMENTS

As previously stated, multiple electrical components in integrated, mincrominiature form are provided in accordance with this invention by bonding together a plurality of superimposed films of electrical conductors of predetermined electrical characteristics separated by films of dielectric material, with electrical terminals extending from predetermined ones of the conductors through the films of dielectric material for selective connection to provide various single, series and parallel circuit component arrangements.

Figure 1:
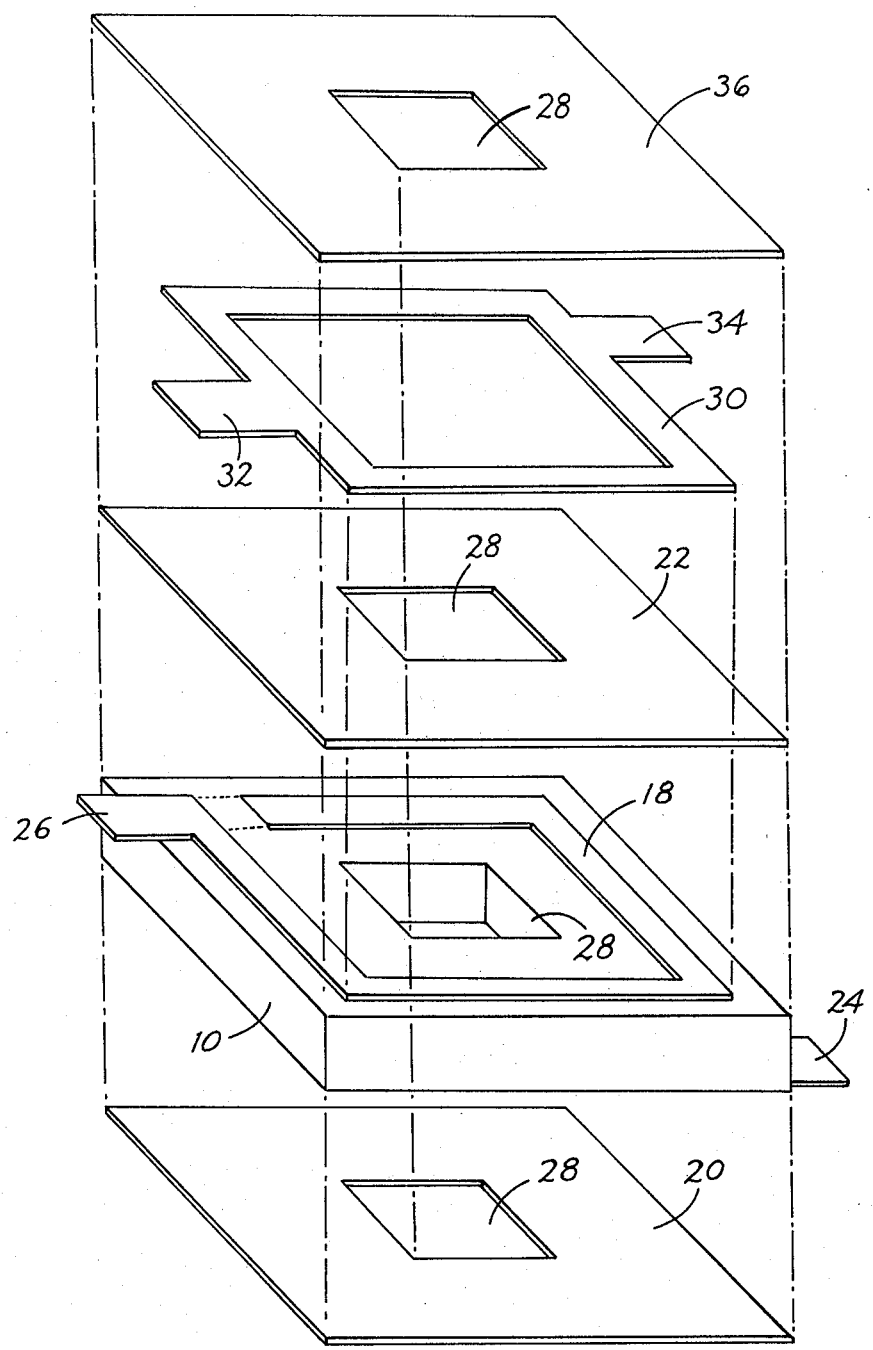
FIG. 1 is an exploded view in perspective, on a substantially enlarged scale, illustrating the manner of assembly of a plurality of electrical component elements to provide an integrated, microminiature structure including a plurality of electrical components, in accordance with this invention.
Figure 2:
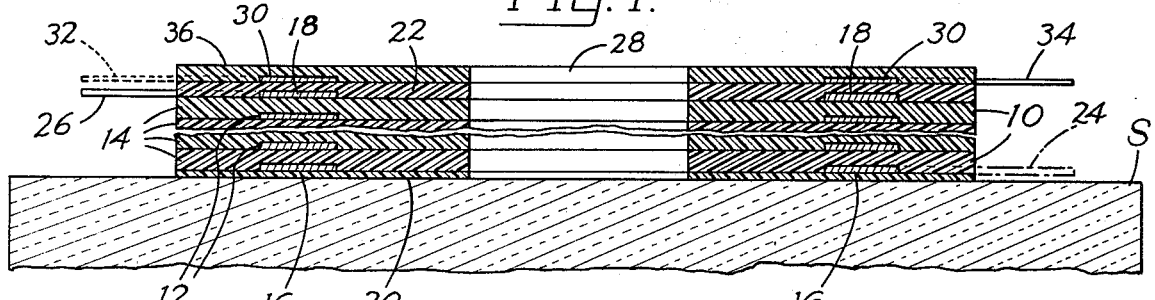
FIG. 2 is a view in transverse section illustrating a preferred construction of the component assembly illustrated in FIG. 1, a substrate support being shown in broken lines.

Referring to FIGS. 1 and 2 of the drawings, there is illustrated an electrical inductor 10 which comprises a plurality of interconnected turns 12 of films of electrically conductive material, the turns being separated from each other by interposed films of dielectric material 14. The opposite end turns 16 and 18 are covered with dielectric films 20 and 22, respectively. Electrical terminals 24 and 26 extend laterally from the end turns 16 and 18, respectively, through the dielectric films. The superimposed films of conductive and dielectric materials are bonded togther as an integral unit. A central opening 28 preferably is provided through the unit, to enable a pair of such inductors to be coupled together by a loop of magnetic metal, to function as a transformer.

The films forming the coil turns 12 and dielectric separators 14, as well as the additional films described hereinafter, may be formed by the thick or thin film techniques well known in the art, but preferably are formed by the vapor depositions of electrically conductive materials and dielectric materials on the planar surface of a single substrate S (FIG. 2) in the manner described in my U.S. Pat. No. 3,785,046.

In accordance with the present invention, one or both of the end turns 16, 18 of the inductor coil may be formed with a predetermined electrical resistance greater than the resistance of the remaining turns. In this manner, the combination of turns forms a series RL circuit.

Alternatively, one or both of the end turns 16, 18 of the inductor 10 may serve as one plate of a capacitor, whereby to form a series LC circuit. For this purpose, the second capacitor plate is provided by a film 30 of conductive material applied over the corresponding end of the coil for cooperative association with said one capacitor plate. If turn 16 is the one capacitor plate, film 30 is deposited on the substrate S first before dielectric film 20 (FIG. 2). In either event, said second plate 30 is separated electrically from the first plate 16 or 18 by the interposed dielectric film 20 or 22, respectively, as will be understood. One or more electrial terminals, preferably a pair of terminals 32, 34 are extended from the second capacitor plate 30. A dielectric film 36 is applied over the second plate 30, and the assembly bonded together as an integral unit.

In the event the end turns 16, 18 of the inductor are not utilized as condenser plates, a pair of the film plates 30, separated by a dielectric film 36, may be applied over one or both ends of the inductor 10. By this arrangement the inductor and capacitor may be utilized as separate components, or they may be connected together in series or in parallel, by appropriate interconnection of the terminals 24, 26, 32 and 34.

An electrically conductive film 30 also may be provided with a predetermined electrical resistance and combined with an inductor 10, as in FIG. 1, for selective use of the inductor and resistor separately, or in series or in parallel.

Thus, it will be appreciated that any desired number of electrically conductive films 30 may be incorporated into a laminated, integrated structure, in accordance with my patent identified hereinbefore, to provide any desired number of capacitor plates or resistors. Various combinations of such elements are illustrated in FIGS. 3-10.

Figure 3:
FIGS. 3-10 are exploded views in side elevation illustrating various arrangements of electrical component elements, in accordance with this invention.
Figure 3A:
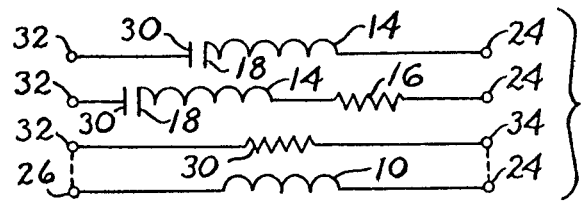

FIG. 3 illustrates the microminiature assembly of FIGS. 1 and 2, and FIG. 3a illustrates various circuit arrangements afforded thereby. Thus, the uppermost circuit arrangement is a series LC circuit formed by utilizing the inductor end turn 18 as a capacitor plate in association with the second plate 30. The next lower circuit arrangement is an RLC circuit formed by utilizing the inductor end turn 16 as a resistor and the opposite end turn 18 as a capacitor plate. The lower two diagrams illustrate the use of the film 30 as a resistor in association with the inductor 10. These components may be utilized separately, or they may be connected together in series or in parallel, as indicated by one or both of the broken lines interconnecting the terminals.

It is to be noted that when an end turn 16 or 18 of the inductor 10 is utilized as a capacitor plate or as a resistor, the lead connection between it and the adjacent turn of the inductor coil is eliminated, with corresponding elimination of the adverse effects normally encountered because of the leads employed to interconnect discreet components. Further when conductive film 30 is provided as an electrical resistor and its terminal 32 is connected to the end terminal 26 of the inductor 10, the adverse effects resulting from the interconnection of these extremely short leads are reduced to absolute minimum.

Figure 4:
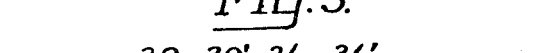
Figure 4A:
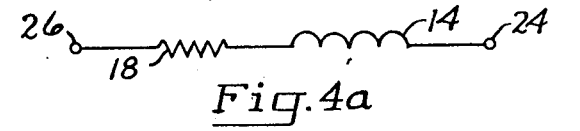

FIG. 4 illustrates a single inductor 10 in which the end turn 18 (or, if desired, the opposite end turn 16) is formed with a predetermined electrical resistance greater than the resistance of the remaining turns. This arrangement provides a series RL circuit, as illustrated in FIG. 4a.

Figure 5:
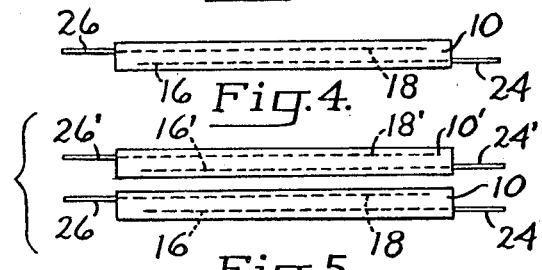
Figure 5A:
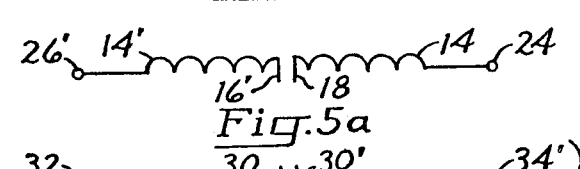

FIG. 5 illustrates two inductors 10 and 10' bonded together as an integrated unit. The two inductors may be utilized separately as individual inductors, or they may be utilized as a series LCL circuit as illustrated in FIG. 5a. Additionally, a series resistance may be included in the circuit of FIG. 5a, by providing one of the end turns 16 or 18' as an electrical resistance, as explained hereinbefore.

Figure 6:
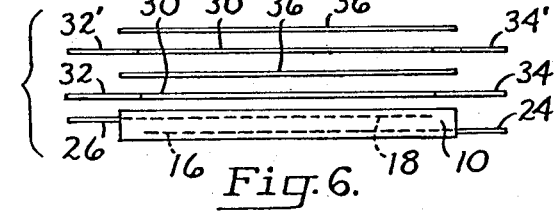
Figure 6A:
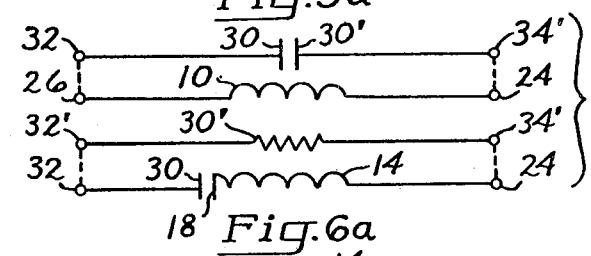

FIG. 6 illustrates an assembly of an inductor 10 and a pair of conductive films 30 and 30'. As indicated in FIG. 6a, this arrangement may be utilized to provide an inductor and a separate capacitor. These may be utilized separately or may be connected together in series or in parallel. FIG. 6a also illustrates an arrangement whereby the assembly of FIG. 6 may form a separate resistor 30' and a series LC circuit. These may be used separately or connected together in series or in parallel. The arrangement of FIG. 6 also may be connected to form a series RL circuit and a separate capacitor, by forming the first turn 16 of the inductor as a resistor. A series RLC circuit and a separate resistor may also be provided by FIG. 6, by utilizing the first turn 16 as a resistor, the opposite end turn 18 as a capacitor plate associated with a second capacitor plate 30, with film 30' providing a separate resistor.

Figure 7:
Figure 7A:
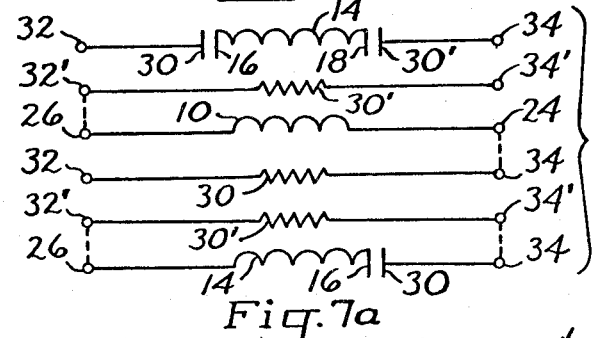

In FIG. 7, a conductive film 30 is applied adjacent the end turn 16 of the inductor 10 and a second conductive film 30' is applied adjacent the opposite end turn 18. As indicated in FIG. 7a, this arrangement affords the formation of a series CLC circuit; separate resistors 30, 30' at opposite ends of the inductor 10 for use separately or in series in parallel arrangements; and as a separate resistor 30' an LC circuit for separate, series or parallel arrangements. The arrangement of FIG. 7 also affords the formation of a series RL circuit and a separate resistor, or the formation of a series RLC circuit.

Figure 8:
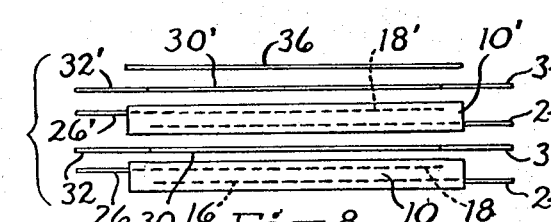
Figure 8A:
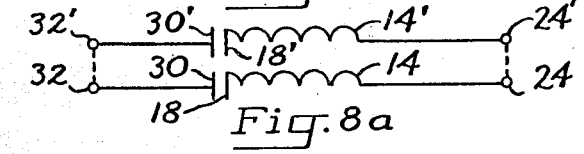

The arrangement illustrated in FIG. 8 affords the formation of a pair of series LC circuits, as illustrated in FIG. 8a. By providing the end turn 16 as an electrical resistor, the arrangement may provide a pair of series RLC circuits. In either case, the separate circuits may be utilized separately, or they may be connected together in series or in parallel. Further, by providing the conductive films 30 and 30' as electrical resistors, the arrangement of FIG. 8 may provide a pair of resistors and a pair of inductors usable separately or connected together in various series and parallel configurations.

Figure 9:
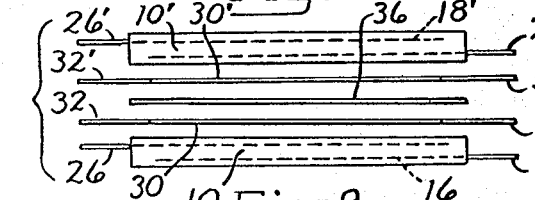
Figure 9A:
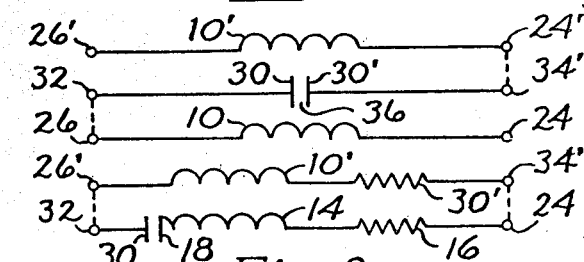

The arrangement of FIG. 9 comprises a rearrangement of the elements in FIG. 8 and, as indicated in FIG. 9a, provides a pair of separate inductors 10 and 10' and a separate capacitor. These components may be utilized separately or maybe connected together in various series and parallel configurations. Also as indicated in FIG. 9a by forming the end turn 16 of the inductor 10 as a resistor and utilizing the opposite end turn 18 as a capacitor plate and providing the conductive film 30' as an electrical resistor, the arrangement of FIG. 9 may form a series RL circuit and a separate series RLC circuit. These may be utilized separately, or connected together in series or in parallel. Further, by providing the conductive films 30 and 30' as electrical resistors, the arrangement of FIG. 9 may form separate pairs of inductors and resistors which may be used separately or connected together in various series and parallel arrangements.

Figure 10:
Figure 10A:
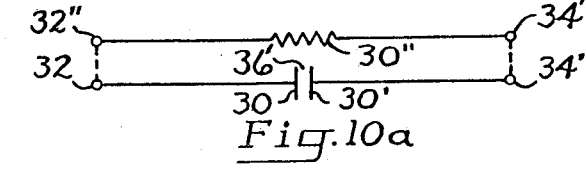

FIG. 10 illustrates an assembly of conductive films wherein the films 30 and 30' form the plates of a capacitor and film 30" is provided as an electrical resistor. As indicated in FIG. 10a, these components may be utilized separately, or may be connected together in series or in parallel.

From the foregoing, it will be appreciated that the present invention provides simplified and economical means by which to provide a wide variety of multiple electrical components in the form of integrated, microminiature structures which may be utilized in a wide variety of separate, series and parallel configurations. In many of these the leads which interconnected components are either wholly or substantially eliminated with corresponding elimination or reduction of the adverse effects experienced heretofore in the interconnection of discreet electrical components. The physical dimensions of the integrated structures are significantly less than those of prior discreet components. When utilizing the method of manufacture disclosed in my earlier patent identified hereinbefore, the integrated structures of this invention are provided in microminiature sizes at minimum cost.

It will be apparent to those skilled in the art that various changes may be made in the method and in the size, shape, type, number and arrangement of parts described hereinbefore, without departing from the spirit of this invention.

Having now described my invention and the manner in which it may be used, I claim:

1. A method of making an integrated one-piece microminiature series circuit having a central opening comprising at least a capacitor and a helical inductor coil which are integrated with one another and which are disposed so that one overlies the other, said capacitor and said coil both having central openings and being contained within the same transverse area; said method comprising the steps of providing a substrate, applying and bonding to each other a plurality of superposed films on said substrate to define said series circuit, each said films having a central opening, alternate layers of said films being comprised of electrically conductive material and dielectric material, said layers of conductive material being separated from one another by said layers of dielectric material, interconnecting some of said adjacent overlying layers of conductive material to provide said helical inductor coil, one of the layers of conductive material defining a first capacitor plate, the layer of conductive material defining the end of turn of said helical coil which is closest to said first capacitor plate comprising a second capacitor plate whereby said first and second capacitor plates define said capacitor, and providing electrical connection means at the other end turn of said inductor coil and from said first capacitor plate so that said inductor coil and said capacitor comprise an integrated one piece series circuit.

2. A method as defined in claim 1 including the step of providing a resistor in said series circuit by making the resistance of said other end turn of said inductor coil a predeterminal resistance which is greater than the resistance of said inductor coil so that said helical inductor coil and said capacitor comprise an integrated one piece series circuit with said resistor.

3. A method of making an integrated one-piece microminiature circuit have a central opening comprising at least a capacitor and a helical inductor coil which are disposed so that one overlies the other, said capacitor and said coil both having central openings and being contained within the same transverse area and being selectively connectable as separate components, as part of a series circuit or as part of a parallel circuit; said method comprising the steps of providing a substrate, applying and bonding to each other a plurality of superposed films on said substrate to define said circuit, alternate layers of said films being comprised of electrically conductive material and dielectric material, said layers of conductive material being separated from one another by said layers of dielectric material, interconnecting some of adjacent overlying layers of said conductive material to provide said helical inductor coil, two of said layers of conductive material defining first and second capacitor plates respectively, and extending electrical terminals laterally outward from the layers of conductive material comprising the end turns of said helical coil and from the layers of conductive material comprising each of said capacitor plates so that said inductor coil and said capacitor plates can be selectively connected as separate components, as part of a series circuit or as part of a parallel circuit.

4. A method as defined in claim 3 including the step of providing a resistor in said circuit by applying at least an additional layer of conductive material and dielectric material, said layers of conductive material being separated from one another by said layers of dielectric material and having a predetermined resistance which is greater than the resistance of said coil, extending electrical terminals laterally outward from said resistor so that said resistor can be selectively connected as a separate component, as part of said series circuit or as part of said parallel circuit.

* * * * *